(12) United States Patent
Um et al.

(10) Patent No.: US 12,706,279 B2
(45) Date of Patent: Aug. 11, 2026

(54) APPARATUS AND METHOD FOR PROCESSING SUBSTRATE USING PLASMA

(71) Applicant: SEMES CO., LTD., Chungcheongnam-do (KR)

(72) Inventors: Young Je Um, Busan (KR); Wan Jae Park, Gyeonggi-do (KR); Joun Taek Koo, Seoul (KR); Dong Hun Kim, Seoul (KR); Seong Gil Lee, Gyeonggi-do (KR); Ji Hwan Lee, Incheon (KR); Dong Sub Oh, Busan (KR); Myoung Sub Noh, Gyeonggi-do (KR); Du Ri Kim, Incheon (KR)

(73) Assignee: SEMES CO., LTD., Chungcheongnam-do (KR)

( * ) Notice: Subject to any disclaimer, the term of this patent is extended or adjusted under 35 U.S.C. 154(b) by 524 days.

(21) Appl. No.: 17/712,044

(22) Filed: Apr. 1, 2022

(65) Prior Publication Data

US 2023/0317419 A1 Oct. 5, 2023

(51) Int. Cl.
*H01J 37/32* (2006.01)

(52) U.S. Cl.
CPC .. *H01J 37/32449* (2013.01); *H01J 37/32724* (2013.01); *H01J 2237/3344* (2013.01)

(58) Field of Classification Search
None
See application file for complete search history.

(56) References Cited

U.S. PATENT DOCUMENTS 7,605,063 B2 10/2009 Chebi et al.
9,349,605 B1 5/2016 Xu et al.
10,424,463 B2 9/2019 Xu et al.
10,424,464 B2 9/2019 Xu et al.
11,004,661 B2 5/2021 Tran et al.
11,728,139 B2 8/2023 Tran et al.
(Continued)

FOREIGN PATENT DOCUMENTS

KR 10-2009-0012355 2/2009
KR 10-0971045 7/2010
(Continued)

OTHER PUBLICATIONS

English Machine Translation of Kim (KR20180024277A) retrieved from ESPACENET Oct. 10, 2025 (Year: 2025).*
(Continued)

*Primary Examiner* — Ram N Kackar
*Assistant Examiner* — Laureen Chan
(74) *Attorney, Agent, or Firm* — WOMBLE BOND DICKINSON (US) LLP

(57) ABSTRACT

Provided are a substrate processing apparatus and method capable of improving line edge roughness (LER). The substrate processing apparatus comprises a plasma generating space disposed between an electrode and an ion blocker, a processing space disposed under the ion blocker and for processing a substrate, a first gas supply module for providing a first gas for generating plasma to the plasma generating space, and a second gas supply module for providing an unexcited second gas to the processing space, wherein the first gas is a hydrogen-containing gas, the second gas includes a nitrogen-containing gas, and the substrate includes a photoresist pattern including carbon.

12 Claims, 7 Drawing Sheets

(56) References Cited

U.S. PATENT DOCUMENTS

2007/0234962 A1* 10/2007 Suzuki .............. C23C 16/45565 118/726
2007/0264841 A1* 11/2007 Chebi ............... H01L 21/31138 438/770
2010/0193471 A1* 8/2010 Funk ................. H01J 37/32834 427/569
2014/0227881 A1* 8/2014 Lubomirsky ........... C23C 16/54 156/345.35
2015/0380218 A1* 12/2015 Tan ................... H01J 37/32449 156/345.33
2018/0358244 A1* 12/2018 Lubomirsky ..... H01J 37/32477
2020/0194235 A1 6/2020 Kim et al.
2021/0098232 A1* 4/2021 An ...................... H01L 21/6833
2021/0151300 A1* 5/2021 Jung ................. H01J 37/32724

FOREIGN PATENT DOCUMENTS

KR 10-2015-0121678 10/2015
KR 10-1682081 12/2016
KR 10-2017-0017827 2/2017
KR 10-2018-0014583 2/2018
KR 20180024277 A * 3/2018 ........ H01J 37/32449
KR 10-2018-0038412 4/2018
KR 10-2018-0086151 7/2018
KR 10-2020-0013916 2/2020
KR 10-2020-0039017 4/2020
KR 10-2098002 4/2020
KR 10-2020-0074663 6/2020

OTHER PUBLICATIONS

Notice of Allowance dated Apr. 17, 2024 for Korean Patent Application No. 10-2020-0171943 and its English translation from Global Dossier.

* cited by examiner

APPARATUS AND METHOD FOR PROCESSING SUBSTRATE USING PLASMA

BACKGROUND

1. Field

The present disclosure relates to a substrate processing apparatus and method using plasma.

2. Description of the Related Art

When manufacturing a semiconductor device or a display device, a substrate processing process using plasma may be used. A substrate processing process using plasma includes a capacitively coupled plasma (CCP) method, an inductively coupled plasma (ICP) method, and a method in which the two are mixed according to a method of generating plasma. In addition, dry cleaning or dry etching may be performed using plasma.

SUMMARY

Meanwhile, the photoresist may be classified according to the type of light source used. The photoresist may be classified into, for example, i-line (365 nm), KrF (248 nm), ArF (193 nm), and EUV (Extreme Ultraviolet) (13.5 nm). However, after the ArF and EUV photoresists are patterned, line edge roughness (LER) may be poor or scum may occur.

An object of the present disclosure is to provide a substrate processing apparatus capable of improving line edge roughness (LER).

Another object of the present disclosure is to provide a substrate processing method capable of improving line edge roughness (LER).

The objects of the present disclosure are not limited to the objects mentioned above, and other objects not mentioned will be clearly understood by those skilled in the art from the following description.

One aspect of the substrate processing apparatus of the present disclosure for achieving the above object comprises a plasma generating space disposed between an electrode and an ion blocker; a processing space disposed under the ion blocker and for processing a substrate; a first gas supply module for providing a first gas for generating plasma to the plasma generating space; and a second gas supply module for providing an unexcited second gas to the processing space, wherein the first gas is a hydrogen-containing gas, the second gas includes a nitrogen-containing gas, and the substrate includes a photoresist pattern including carbon.

Another aspect of the substrate processing apparatus of the present disclosure for achieving the above object comprises a first space disposed between an electrode connected to a high-frequency power supply and an ion blocker spaced apart from the electrode, in which plasma is generated based on a hydrogen gas; a second space disposed between the ion blocker and a shower head; a processing space disposed under the shower head and for processing a substrate; a first gas supply module for providing the hydrogen gas to the first space through the electrode; and a second gas supply module for providing an ammonia gas through a central region of the ion blocker and an edge region of the shower head, wherein a substrate including a photoresist pattern including carbon is located in the processing space, wherein ammonia not excited in the processing space and hydrogen radicals formed by the plasma perform isotropic etching on the photoresist pattern to reduce edge roughness of the photoresist pattern.

One aspect of the substrate processing method of the present disclosure for achieving the above object comprises providing a substrate processing apparatus including a first space disposed between an electrode and an ion blocker, a second space disposed between the ion blocker and a shower head, and a processing space disposed under the shower head and for processing a substrate, locating a substrate including a photoresist pattern including carbon in the processing space, providing, in a first section, a nitrogen-containing gas to the processing space to form an atmosphere of the processing space; providing, in a second section, a hydrogen-containing gas to the first space while providing a nitrogen-containing gas to the processing space to form plasma in the first space; and processing the substrate using radicals passing through the ion blocker in an effluent of the plasma and the nitrogen-containing gas.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
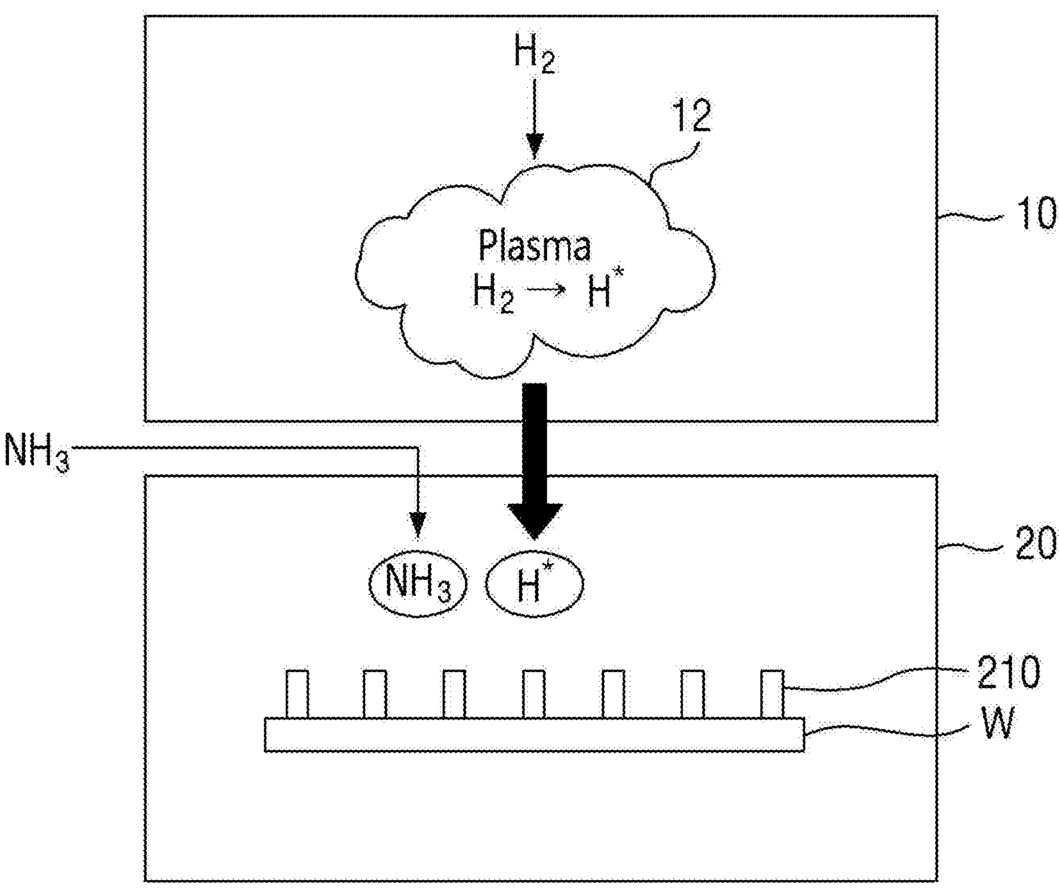
FIG. 1 is a conceptual diagram for describing a substrate processing apparatus according to some embodiments of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Figure 2:
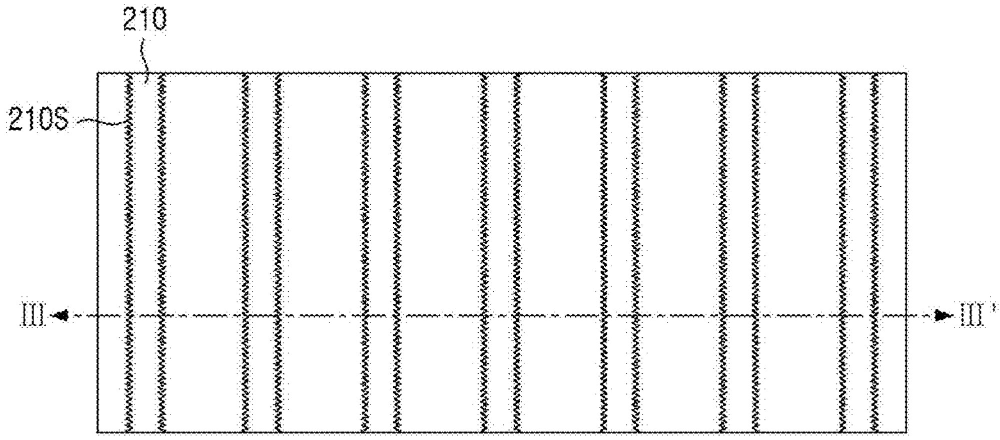
FIG. 2 is a plan view illustrating a photoresist pattern formed on the substrate of FIG. 1.
Figure 3:
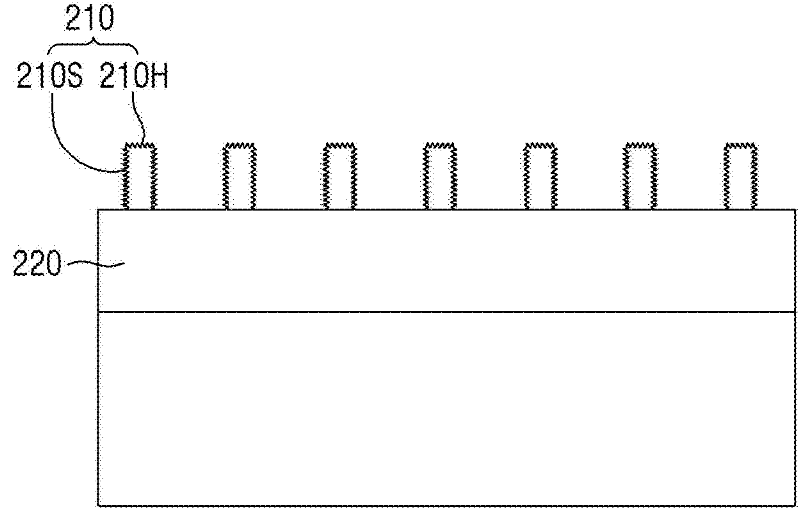
FIG. 3 may be a cross-sectional view taken along III-III line of FIG. 2.
Figure 4:
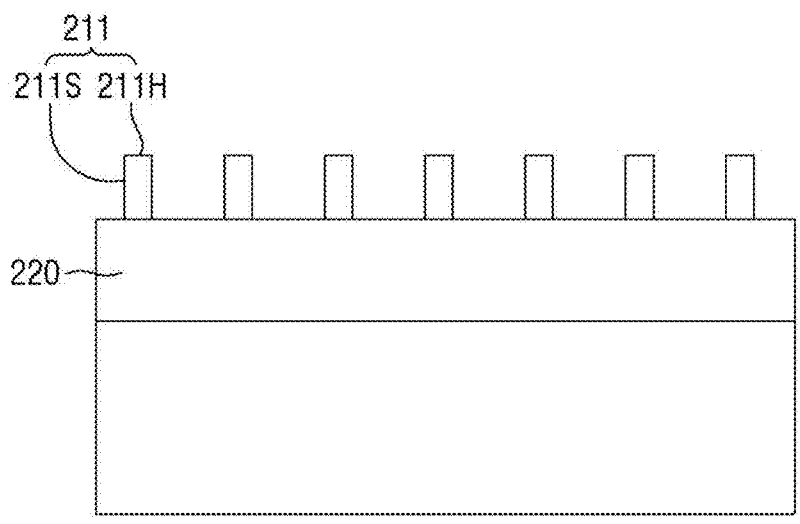
FIG. 4 is a cross-sectional view for describing a result after the photoresist pattern of FIG. 3 is dry cleaned.

FIG. 1 is a conceptual diagram for describing a substrate processing apparatus according to some embodiments of the present disclosure. FIG. 2 is a plan view for describing a photoresist pattern formed on the substrate of FIG. 1, and FIG. 3 is a cross-sectional view taken along line III-III of FIG. 2. FIG. 4 is a cross-sectional view for describing a result after the photoresist pattern of FIG. 3 is dry cleaned.

Referring to FIG. 1, a substrate processing apparatus 1 according to some exemplary embodiments of the present disclosure includes a plasma generating space 10 and a processing space 20 that are separated from each other.

In the plasma generating space 10, plasma 12 is generated using a hydrogen-containing gas (e.g., $H_2$ gas). When the hydrogen-containing gas is excited in the form of plasma, plasma effluents such as hydrogen radicals (H*), hydrogen ions and/or electrons are formed. In the plasma generating space 10, hydrogen radicals H* are provided to the processing space 20, and ions are blocked and not provided to the processing space 20.

A nitrogen-containing gas (e.g., $NH_3$ or $N_2$ gas) is provided in the processing space 20. Since the nitrogen-containing gas does not pass through the plasma generating space 10, it is provided to the processing space 20 in an unexcited state. In the processing space 20, the hydrogen radicals H* and the nitrogen-containing gas in an unexcited state may react and mix with each other to form an etchant.

Meanwhile, the substrate W may be located in the processing space 20. The substrate W may include a photoresist pattern 210 including carbon. The photoresist pattern 210 may be exposed by an ArF (193 nm) or EUV (13.5 nm) light source.

Here, referring to FIGS. 2 and 3, a photoresist pattern 210 elongated in one direction (up-down direction in the drawing) is located on the substrate W. Here, a line-shaped pattern is illustrated by way of example, but the present disclosure is not limited thereto. A layer to be etched (or target layer) 220 for etching using the photoresist pattern 210 may be located under the photoresist pattern 210.

The photoresist pattern 210 shown in FIGS. 2 and 3 shows before dry cleaning is performed. The photoresist pattern 210 includes an upper surface 210H and a side surface 210S. Before dry cleaning is performed, the edge roughness of the upper surface 210H and the side surface 210S is not good.

Referring back to FIGS. 1 to 3, in the processing space 20, hydrogen radicals H* and an unexcited nitrogen-containing gas (e.g., $NH_3$ gas) react with the photoresist pattern 210. For example, as shown in Chemical Formulas 1 to 3, various reactions may proceed.

(Chemical Formula 1)

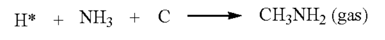

$$H^* + NH_3 + C \longrightarrow CH_3NH_2\ (gas)$$

(Chemical Formula 2)

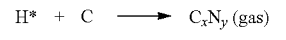

$$H^* + C \longrightarrow C_xN_y\ (gas)$$

(Chemical Formula 3)

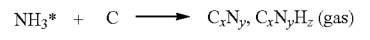

$$NH_3^* + C \longrightarrow C_xN_y,\ C_xN_yH_z\ (gas)$$

That is, hydrogen radicals (H*) and nitrogen-containing gas (e.g., $NH_3$) combine with carbon of the photoresist pattern 210 to generate various types of gases ($CH_3NH_2$, $C_xN_y$, $C_xN_yH_z$), thereby removing some carbon components of the photoresist pattern 210. As a result, edge roughness of the top surface 210H and the side surface 210S of the photoresist pattern 210 may be reduced (i.e., smoothing may be performed).

In particular, since the hydrogen radicals (H*) and the nitrogen-containing gas ($NH_3$) do not have directionality, the photoresist pattern 210 may be isotropically etched. For example, if the photoresist pattern 210 is cleaned using directional hydrogen ions, the edge roughness of the upper surface 210H of the photoresist pattern 210 may be improved, but the edge roughness of the side surface 210S may be difficult to improve. In the substrate processing apparatus according to some embodiments of the present disclosure, since the photoresist pattern 210 is isotropically etched, edge roughness of the upper surface 210H as well as the side surface 210S of the photoresist pattern 210 may be improved. As shown in FIG. 4, the photoresist pattern 211 after dry cleaning may have an upper surface 211H and a side surface 211S having a smooth surface.

In addition, when the photoresist pattern 210 is isotropically etched using a hydrogen radical (H*) and a nitrogen-containing gas ($NH_3$), the photoresist pattern 210 may be finely etched to the level of Angstroms (Å) by controlling the temperature in the processing space 20 and controlling the flow rate of a gas (e.g., $H_2$, $NH_3$) or the like. That is, the degree of etching (i.e., the degree of dry cleaning) of the photoresist pattern 210 can be finely adjusted.

In addition, while the edge roughness of the photoresist pattern 210 is improved, the temperature in the processing space 20 may be maintained at a low temperature (e.g., 0° C. to 50° C.). This is because, if the ArF or EUV photoresist pattern 210 is dry cleaned at a high temperature, the photoresist pattern 210 may be damaged. In particular, the temperature during dry cleaning is maintained below the temperature, at which the photoresist is baked (i.e., curing temperature) (e.g., 110° C. or higher).

Meanwhile, a fluorine-containing gas (e.g., $NF_3$ gas) as well as a hydrogen-containing gas (e.g., $H_2$ gas) may be additionally supplied to the plasma generating space 10. When plasma 12 is generated using a fluorine-containing gas, plasma effluents such as fluorine radicals F*, fluorine ions and/or electrons are formed. In the plasma generating space 10, fluorine radicals F* are provided to the processing space 20, and ions are blocked and not provided to the processing space 20. Fluorine radicals F* may react with carbon of the photoresist pattern 210 in the processing space 20 as shown in Chemical Formula 4 below.

(Chemical Formula 4)

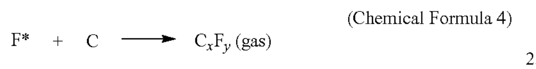

That is, the fluorine radical (H*) combines with carbon of the photoresist pattern 210 to generate a gas ($C_xF_y$), thereby removing some carbon components of the photoresist pattern 210. That is, the edge roughness of the upper surface 210H and the side surface 210S of the photoresist pattern 210 may be improved.

In addition, even when scum is located between adjacent patterns in the photoresist pattern 210, hydrogen radicals (H*) and/or fluorine radicals (H*), nitrogen-containing gas (e.g., $NH_3$) may be used to remove scum.

Figure 5:
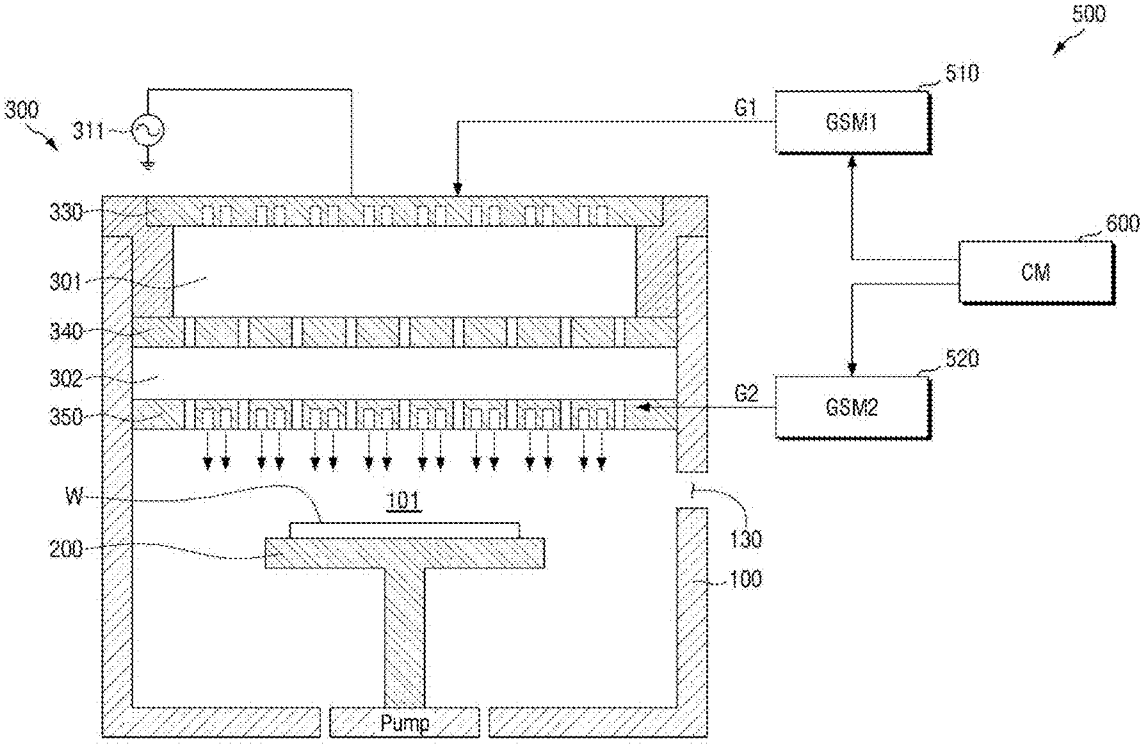
FIG. 5 is a conceptual diagram for describing a substrate processing apparatus according to an embodiment of the present disclosure.

FIG. 5 is a conceptual diagram for describing a substrate processing apparatus according to an embodiment of the present disclosure. The substrate processing apparatus illustrated in FIG. 5 may be an embodiment of the substrate processing apparatus described with reference to FIGS. 1 to 4.

Referring to FIG. 5, the substrate processing apparatus according to the first embodiment of the present disclosure includes a process chamber 100, a support module 200, an electrode module 300, a gas supply module 500, a control module 600, and the like.

The process chamber 100 provides a processing space 101 (corresponding to the processing space 20 of FIG. 1), in which the substrate W is processed. The process chamber 100 may have a circular cylindrical shape. The process chamber 100 is provided with a metal material. For example, the process chamber 100 may be provided with an aluminum material. An opening 130 is formed in one sidewall of the process chamber 100. The opening 130 is used as an entrance, through which the substrate W can be carried in and out. The entrance can be opened and closed by a door. An exhaust port (not shown) is installed on the bottom surface of the process chamber 100. The exhaust port functions as an outlet 150, through which by-products generated in the processing space 101 are discharged to the outside of the process chamber 100. The exhaust operation is performed by the pump.

The support module 200 is installed in the processing space 101 and supports the substrate W. The support module 200 may be an electrostatic chuck that supports the substrate W using an electrostatic force, but is not limited thereto. The electrostatic chuck may comprise a dielectric plate, on which the substrate W is placed, an electrode installed in the dielectric plate and providing electrostatic force so that the substrate W is adsorbed to the dielectric plate, and a heater installed in the dielectric plate and heating the substrate W to control the temperature of the substrate W.

The electrode module 300 includes an electrode (or upper electrode) 330, an ion blocker 340, a shower head 350, and the like, and serves as a capacitively coupled plasma source. The gas supply module 500 includes a first gas supply module 510 and a second gas supply module 520. The control module 600 controls gas supply to the gas supply modules 510 and 520. A gas supply method by the gas supply module 500 and the control module 600 will be described in detail later with reference to FIGS. 6, 8 and 9.

A first space (i.e., a plasma generating space 10 in FIG. 1) 301 is disposed between the electrode 330 and the ion blocker 340, and a second space 302 is disposed between the ion blocker 340 and the shower head 350. The processing space 101 is located under the shower head 350.

The electrode 330 may be connected to a high-frequency power supply 311, and the ion blocker 340 may be connected to a constant voltage (e.g., a ground voltage). The electrode 330 includes a plurality of first supply holes. The first gas supply module 510 provides the first gas G1 to the first space 301 through the electrode 330 (i.e., the first supply hole of the electrode 330). The electromagnetic field generated between the electrode 330 and the ion blocker 340 excites the first gas G1 into a plasma state. The first gas excited into a plasma state (i.e., plasma effluent) comprises radicals, ions and/or electrons. The first gas G1 may be a hydrogen-containing gas (e.g., $H_2$ gas).

The ion blocker 340 is formed of a conductive material, and may have, for example, a plate shape such as a disk. The ion blocker 340 may be connected to a constant voltage, but is not limited thereto. The ion blocker 340 includes a plurality of first through holes formed in the vertical direction. Radicals or uncharged neutral species in the plasma effluent may pass through the first through hole of the ion blocker 340. On the other hand, it is difficult for charged species (i.e., ions) to pass through the first through hole of the ion blocker 340. That is, when plasma is formed using hydrogen gas, hydrogen radicals H* are provided to the second space 302.

The shower head 350 may be formed of a conductive material and may have, for example, a plate shape such as a disk. The shower head 350 may be connected to a constant voltage, but is not limited thereto. The shower head 350 includes a plurality of second through holes formed in the vertical direction. Plasma effluent (i.e., hydrogen radicals (H*)) passing through the ion blocker 340 is provided to the processing space 101 through the second space 302 and the second through hole of the shower head 350.

The shower head 350 may further include a plurality of supply holes. The second gas supply module 520 provides the second gas G2 to the processing space 101 through the shower head 350 (i.e., the second supply hole of the shower head 350). The second gas G2 may be a nitrogen-containing gas, for example, an ammonia ($NH_3$) gas. In the processing space 101, the second gas G2 may be mixed with the plasma effluent (i.e., hydrogen radicals H*) that has passed through the ion blocker 340.

As described above, the substrate W is located on the support module 200 in the processing space 101. The substrate W may include a photoresist pattern including carbon (see 210 of FIG. 3). The photoresist pattern 210 may be exposed by an ArF (193 nm) or EUV (13.5 nm) light source.

In order to dry clean the photoresist pattern 210, a hydrogen-containing gas (e.g., hydrogen ($H_2$) gas) may be used as the first gas G1, and a nitrogen-containing gas (e.g., ammonia ($NH_3$) gas) may be used as the second gas G2. Additionally, the third gas G3 for generating plasma may be provided to the first space 301 through the supply hole of the electrode 330. The third gas G3 may be a fluorine-containing gas (e.g., nitrogen trifluoride ($NF_3$) gas). In addition, an auxiliary gas (e.g., He, Ar, $N_2$, etc.) may be provided to the first space 301 through the supply hole of the electrode 330.

As described above, the edge roughness of the upper surface 210H and the side surface 210S of the photoresist pattern 210 may be reduced by using ammonia gas, hydrogen radicals (H*) and/or fluorine radicals (F*). Ammonia gas, hydrogen radicals (H*) and/or fluorine radicals (F*) react with carbon of the photoresist pattern 210, so that it is possible to reduce edge roughness of the photoresist pattern 210 by forming $CH_3NH_2$ (gas), $C_xN_y$ (gas), $C_xN_yH_z$ (gas), and $C_xF_y$ (gas).

On the other hand, during the dry cleaning process of reducing the edge roughness of the photoresist pattern 210, the pressure in the processing space 20 may be 0.1 to 9 Torr, and the temperature of the support module 200 may be greater than 0° C. and less than 5° C. That is, since the dry cleaning process is performed at a low temperature, damage to the photoresist pattern 210 may be minimized.

Figure 6:
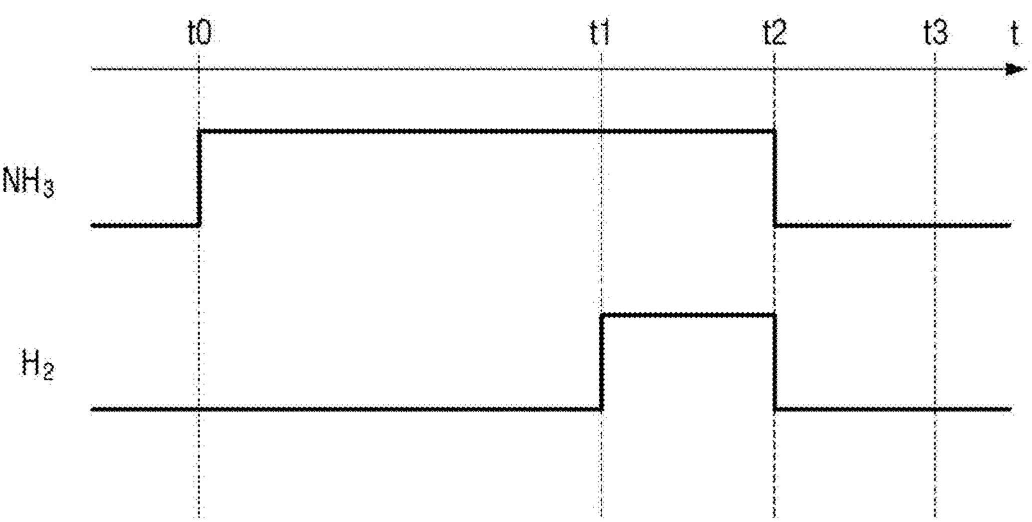
FIG. 6 is a view for describing a substrate processing method according to some embodiments of the present disclosure.
Figure 7:
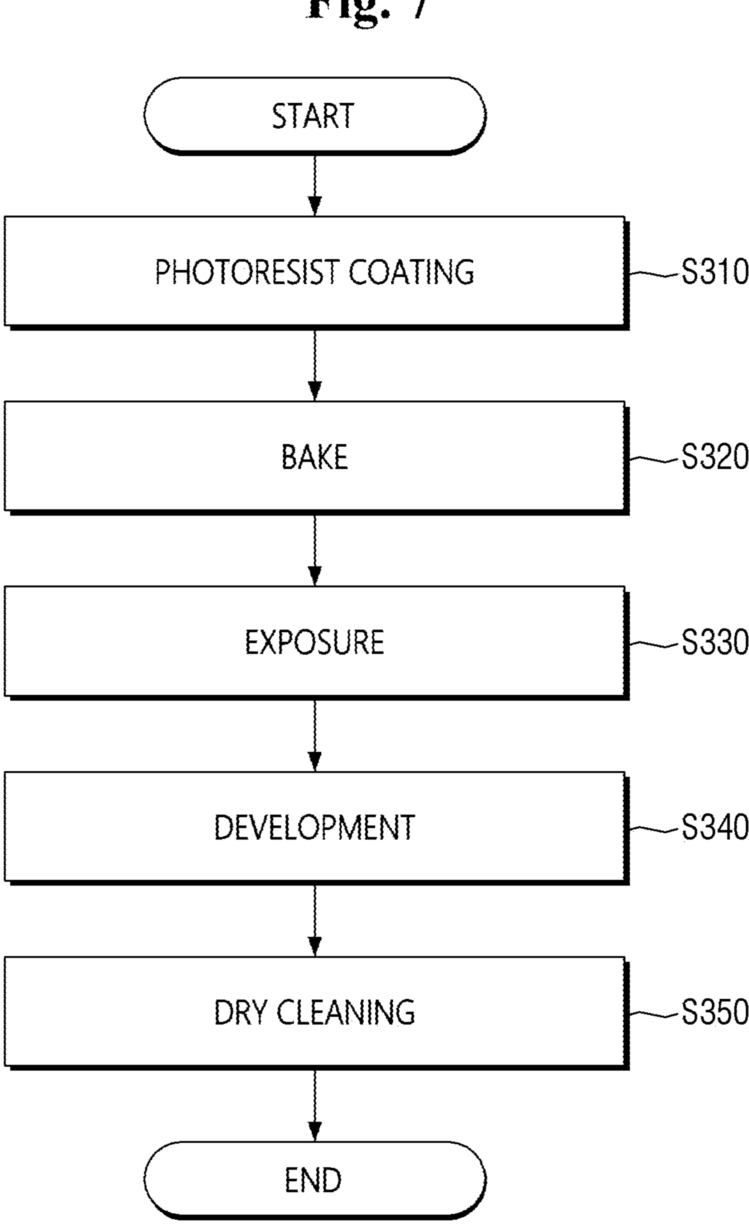
FIG. 7 is a flowchart illustrating a substrate processing method according to some embodiments of the present disclosure.

A substrate processing method according to some embodiments of the present disclosure will be described in more detail with reference to FIGS. 6 and 7. FIG. 6 is a diagram for describing a substrate processing method (dry cleaning) according to some embodiments of the present disclosure, and FIG. 7 is a flowchart for describing a substrate processing method according to some embodiments of the present disclosure.

First, referring to FIGS. 5 and 6, before plasma is formed at time t0, a second gas G2 (ammonia gas) is provided in the processing space 101 of the process chamber 100 to form a process atmosphere.

Between time t1 and time t2, a first gas G1 (hydrogen gas) is provided to the first space 301. Then, the high-frequency power supply 311 is supplied to the electrode 330 to excite the first gas G1 in the form of plasma in the first space 301. Plasma effluents such as radicals, ions and/or electrons are formed. The ions may be filtered by the ion blocker 340 and the remaining plasma effluent may pass through the ion blocker 340. The plasma effluent passing through the ion blocker 340 is provided to the processing space 101 through the second space 302 and the shower head 350. In the processing space 101, the plasma effluent passing through the ion blocker 340 and the second gas G2 (ammonia gas) react and mix with each other to form an etchant. Hydrogen radicals (H*) and ammonia gas ($NH_3$) that are the plasma effluents react with carbon to form gaseous $CH_3NH_2$, $C_xN_y$, $C_xN_yH_z$, etc. During this reaction process, the temperature of the support module 200 may be maintained at 0° C. to 50° C.

From time t2 to time t3, the pump is operated to remove by-products. $CH_3NH_2$, $C_xN_y$, $C_xN_yH_z$, etc., which are by-products, are in gaseous form and may be removed by a pump.

Here, referring to FIG. 7, a photoresist is coated on the substrate in the first chamber (S310). For example, while rotating the substrate, the photoresist may be sprayed onto the substrate to be coated.

Next, the substrate is baked (or soft baked) in the second chamber to remove a solvent of the photoresist to cure the photoresist (S320). Next, an exposure process of exposing the photoresist to light (ArF or EUV) is performed in the third chamber (S330). Next, the exposed photoresist is developed in the fourth chamber (S340). Next, in order to improve the edge roughness of the photoresist in the fifth chamber, the dry cleaning described with reference to FIGS. 1 to 6 is performed (S350).

The temperature, at which the substrate and the photoresist are baked in step S320 (i.e., the temperature of the support module supporting the substrate), may be, for example, 110° C. or higher. On the other hand, the temperature, at which the substrate is dry cleaned in step S350 (i.e., the temperature of the support module supporting the substrate), may be lower than the temperature, at which the photoresist is baked. For example, the temperature of the support module during dry cleaning may be greater than 0° C. and less than 50° C.

Figure 8:
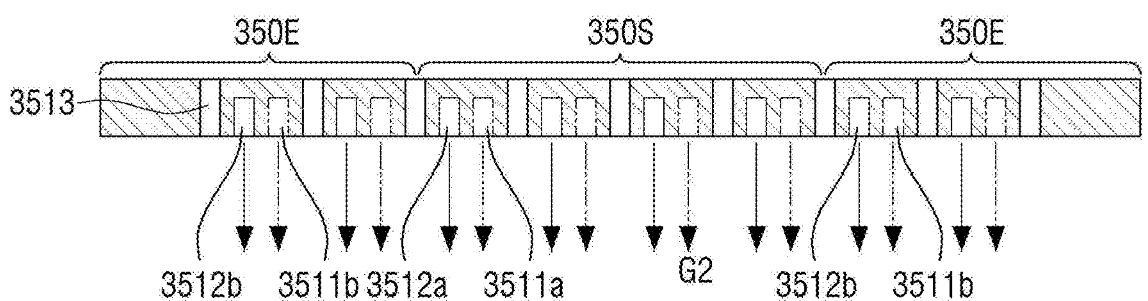
FIG. 8 is a view for describing an example of the shower head of FIG. 5.

FIG. 8 is a view for describing an example of the shower head of FIG. 5.

Referring to FIG. 8, the shower head 350 includes a first shower region 350S and a second shower region 350E disposed outside the first shower region 350S. The first shower region 350S may be disposed in a central region of the shower head 350, and the second shower region 350E may be disposed in an edge region of the shower head 350.

The shower head 350 includes a plurality of supply holes 3511*a* and 3511*b* and a plurality of supply holes 3512*a* and 3512*b*. Supply holes 3511*a* and 3512*a* are installed in the first shower region 350S, and supply holes 3511*b* and 3512*b* are installed in the second shower region 350E. The second gas supply module 520 supplies the second gas G2 to the processing space 101 through the shower head 350 (i.e., the supply holes 3511*a* and 3511*b* and the supply holes 3512*a* and 3512*b* of the shower head 350). A through hole 3513 is formed in the front surface of the shower head 351.

In an embodiment, the flow rates of the second gas G2 provided to the processing space 101 through the supply holes 3511*a* and 3512*a* and the supply holes 3511*b* and 3512*b* may be the same as each other.

In another embodiment, the flow rate of the second gas G2 provided through the supply holes 3511*a* and 3512*a* and the flow rate of the second gas G2 provided through the supply holes 3511*b* and 3512*b* may be different from each other.

For example, the dry cleaning amount of a specific region (e.g., the central region) and the dry cleaning amount of another region (e.g., the edge region) on the substrate W may be different from each other. In this case, the second gas G2 provided through the supply holes 3511*a*, 3512*a*, 3511*b*, and 3512*b* may be adjusted differently in order to make the dry cleaning amount on the entire substrate W constant (that is, to increase the uniformity).

Figure 9:
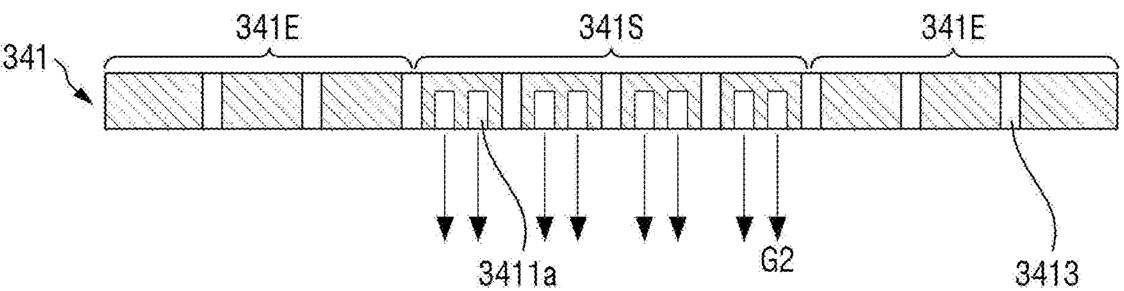
FIG. 9 is a view for describing an example of the ion blocker and the shower head of FIG. 5.
Figure 9:
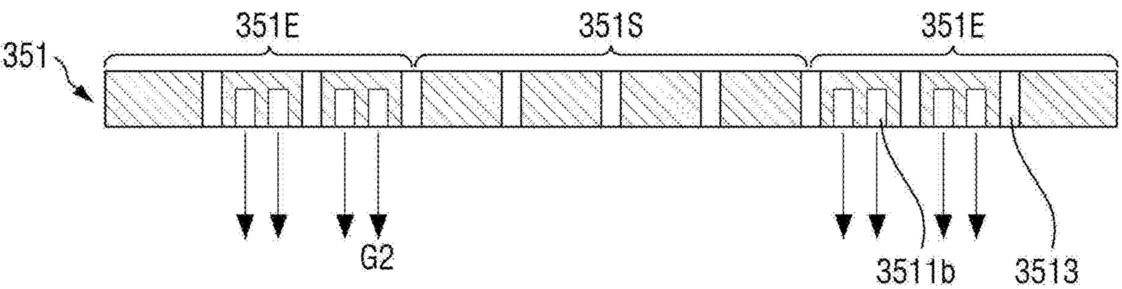

FIG. 9 is a view for describing an example of the ion blocker and the shower head of FIG. 5.

In FIG. 5, it has been described that the second gas G2 is provided to the processing space 20 through the shower head (350 in FIG. 5), but in FIG. 9, the second gas G2 may be provided through the ion blocker 341 and the shower head 351.

Specifically, referring to FIG. 9, the ion blocker 341 includes a first filter region 341S and a second filter region 341E disposed outside the first filter region 341S. The first filter region 341S may be disposed in a central region of the ion blocker 341, and the second filter region 341E may be disposed in an edge region of the ion blocker 341.

The shower head 351 includes a first shower region 351S and a second shower region 351E disposed outside the first shower region 351S. The first shower region 351S may be disposed in a central region of the shower head 351, and the second shower region 351E may be disposed in an edge region of the shower head 351.

In particular, the supply hole 3411*a* may be formed in the first filter region 341S of the ion blocker 341, and the supply hole may not be formed in the second filter region 341E. On the other hand, a supply hole is not formed in the first shower region 351S of the shower head 351 and a supply hole 3511*b* is formed in the second shower region 351E. A through hole 3413 (i.e., for passing through hydrogen radicals H* of plasma) is formed on the front surface of the ion blocker 341, and a through hole 3513 is formed on the front surface of the shower head 351.

In this structure, the second gas G2 may be supplied through the first filter region 341S and the second shower region 351E. The second gas G2 is supplied through the supply hole 3411*a* of the first filter region 341S and the supply hole 3511*b* of the second shower region 351E.

Figure 10:
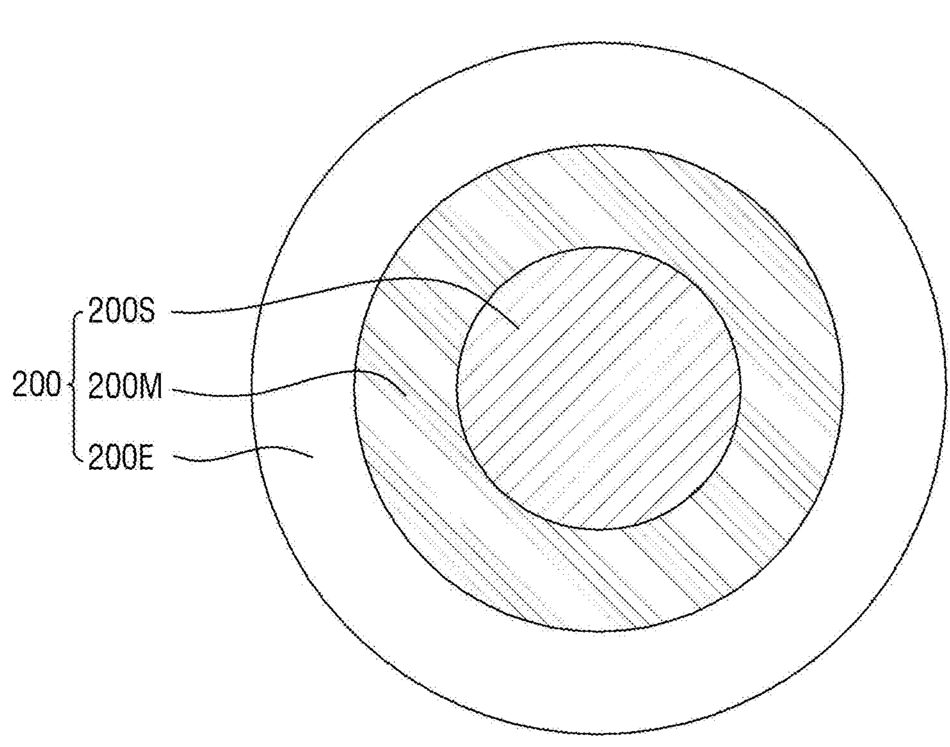
FIG. 10 is a conceptual diagram illustrating a support module of the substrate processing apparatus of FIG. 5.

FIG. 10 is a conceptual diagram illustrating a support module of the substrate processing apparatus of FIG. 5. Referring to FIG. 10, the support module 200 is divided into a plurality of regions 200S, 200M, and 200E, and temperatures of the plurality of regions 200S, 200M, and 200E may be individually controlled. If there is a region in the substrate W where the dry cleaning rate needs to be increased (e.g., the central region of the substrate W), the temperature of the corresponding region (e.g., 200S) may be increased.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. An apparatus for processing a substrate comprising:
- a first space disposed between an electrode and an ion blocker;
- a second space formed between the ion blocker and a shower head spaced apart from each other;
- a processing space disposed under the shower head and the ion blocker and for processing a substrate;
- a first gas supply module for providing a first gas for generating plasma to the first space; and
- a second gas supply module for providing an unexcited second gas to the processing space,
- wherein the shower head includes a first shower region and a second shower region surrounding the first shower region, the shower head comprises supply holes configured to directly supply the second gas, supplied to the shower head by the second gas supply module, toward the processing space disposed under the shower head, wherein the supply holes are formed only on a lower surface facing the processing space positioned under the shower head and the supply holes formed only on the lower surface of the shower head are located only at the second shower region of the shower head surrounding the first shower region where the supply holes formed only on the lower surface of the shower head are not formed,
- wherein the apparatus further comprises the ion blocker having a first filter region and a second filter region surrounding the first filter region, the ion blocker comprises other supply holes configured to supply the second gas, and the other supply holes of the ion blocker are located only at the first filter region which corresponds to the first shower region of the shower head where the supply holes of the shower head are not formed and is surrounded by the second filter region of the ion blocker, wherein the second filter region of the ion blocker corresponds to the second shower region of the shower head where the supply holes of the shower head are formed, and where the other supply holes of the ion block are not formed, and
- wherein the first gas is a hydrogen-containing gas, the second gas includes a nitrogen containing gas, and the substrate includes a photoresist pattern including carbon.

2. The apparatus of claim 1, wherein the first gas is an $H_2$ gas and the second gas is an $NH_3$ gas.

3. The apparatus of claim 1 further comprises,
- a support module installed in the processing space and for supporting the substrate,
- wherein a temperature of the support module is lower than a curing temperature of a photoresist including carbon.

4. The apparatus of claim 3, wherein the temperature of the support module is greater than 0° C. and less than 50° C.

5. The apparatus of claim 1, wherein the second gas is supplied through the first filter region and the second shower region, and is not supplied through the second filter region and the first shower region.

6. The apparatus of claim 1, wherein the second gas is supplied through the first shower region and the second shower region, wherein a flow rate of the second gas supplied through the first shower region and a flow rate of the second gas supplied through the second shower region are different from each other.

7. An apparatus for processing a substrate comprising:
- a first space disposed between an electrode connected to a high-frequency power supply and an ion blocker spaced apart from the electrode, in which plasma is generated based on a hydrogen gas;
- a second space disposed between the ion blocker and a shower head;
- a processing space disposed under the shower head and for processing a substrate;
- a first gas supply module for providing the hydrogen gas to the first space through the electrode; and
- a second gas supply module for providing a second gas comprising an ammonia gas,
- wherein the shower head includes a first shower region and a second shower region surrounding the first shower region, the shower head comprises supply holes configured to directly supply the second gas, supplied to the shower head by the second gas supply module, toward the processing space disposed under the shower head, wherein the supply holes are formed only on a lower surface facing the processing space positioned under the shower head and the supply holes formed only on the lower surface of the shower head are located only at the second shower region of the shower head surrounding the first shower region where the supply holes formed only on the lower surface of the shower head are not formed,
- wherein the apparatus further comprises the ion blocker having a first filter region and a second filter region surrounding the first filter region, the ion blocker comprises other supply holes configured to supply the second gas, and the other supply holes of the ion blocker are located only at the first filter region which corresponds to the first shower region of the shower head where the supply holes of the shower head are not formed and is surrounded by the second filter region of the ion blocker, wherein the second filter region of the ion blocker corresponds to the second shower region of the shower head where the supply holes of the shower head are formed, and where the other supply holes of the ion block are not formed, wherein a substrate including a photoresist pattern including carbon is located in the processing space, and wherein ammonia not excited in the processing space and hydrogen radicals formed by the plasma perform isotropic etching on the photoresist pattern to reduce edge roughness of the photoresist pattern.

8. The apparatus of claim 7 further comprises, a support module installed in the processing space and for supporting the substrate, wherein a temperature of the support module is lower than a curing temperature of a photoresist including carbon.

9. The apparatus of claim 8, wherein a temperature of the support module is greater than 0° C. and less than 50° C.

10. The apparatus of claim 7, wherein the isotropic etching is able to etch a side surface of the photoresist pattern to a level of Angstroms (Å).

11. The apparatus of claim 1, wherein the shower head further comprises other supply holes passing through the shower head, wherein the other supply holes of the showerhead are formed at the first shower region where the supply holes formed only on the lower surface of the shower head are not formed and formed at the second shower region surrounding the first shower region and having the supply holes formed only on the lower surface of the shower head.

12. The apparatus of claim 7, wherein the shower head further comprises other supply holes passing through the shower head, wherein the other supply holes of the showerhead are formed at the first shower region where the supply holes formed only on the lower surface of the shower head are not formed and formed at the second shower region surrounding the first shower region and having the supply holes formed only on the lower surface of the shower head.

* * * * *